United States Patent [19]

Ishibashi

[11] Patent Number: 5,309,034

[45] Date of Patent: May 3, 1994

[54] TIMER CIRCUIT FOR STRETCHING THE DURATION OF AN INPUT PULSE

[75] Inventor: Kenji Ishibashi, Osaka, Japan

[73] Assignee: Sharp Kabushiki Kaisha, Osaka, Japan

[21] Appl. No.: 148,531

[22] Filed: Nov. 8, 1993

Related U.S. Application Data

[63] Continuation of Ser. No. 850,912, Mar. 13, 1992, abandoned.

[30] Foreign Application Priority Data

May 28, 1991 [JP] Japan .................. 3-123349

[51] Int. Cl.⁵ .................. H03K 5/04; H03K 3/017
[52] U.S. Cl. .................. 307/267; 307/265; 307/290; 307/234; 328/58
[58] Field of Search .............. 307/265, 267, 272.1, 307/272.2, 290, 234, 358, 279, 273; 328/58

[56] References Cited

U.S. PATENT DOCUMENTS

| | | | |
|---|---|---|---|
| 4,061,976 | 12/1977 | Sugai | 307/234 |
| 4,293,781 | 10/1981 | Yamada et al. | 307/267 |
| 4,347,617 | 8/1982 | Murano et al. | 307/234 |
| 4,539,489 | 9/1985 | Vaughn | 307/290 |
| 4,583,008 | 4/1986 | Grugett | 307/265 |
| 4,648,021 | 3/1987 | Alberkrack | 307/267 |
| 4,667,118 | 5/1987 | Maruta | 307/265 |
| 4,767,947 | 8/1988 | Shah | 307/268 |
| 4,800,295 | 1/1989 | Minuhin et al. | 307/267 |
| 5,107,137 | 4/1992 | Kinugasa et al. | 307/290 |
| 5,191,245 | 3/1993 | Kang | 307/601 |

FOREIGN PATENT DOCUMENTS

| | | | |
|---|---|---|---|
| 2356997 | 5/1975 | Fed. Rep. of Germany | 307/267 |
| 0170120 | 7/1986 | Japan | 307/265 |
| 0319323 | 12/1989 | Japan | 307/265 |

OTHER PUBLICATIONS

RCA Techinal Notes, Keller et al, "DC Coupled Pulse Stretcher", Sep. 28, 1970, pp. 1-3.

Primary Examiner—Timothy P. Callahan
Assistant Examiner—Terry D. Cunningham
Attorney, Agent, or Firm—Nixon & Vanderhye

[57] ABSTRACT

A timer circuit is provided including a self-holding circuit that includes a reset delay circuit for delaying an input pulse by a prescribed time. The output of the self-holding circuit is caused to fall by the rising edge of the input pulse and to rise by the falling edge of the input pulse or the rising edge of a pulse fed back through the reset delay circuit whichever occurs last. Since the pulse duration can be stretched up to a length equal to the reset delay time by the action of the self-holding circuit, the possibility of the input pulse being split through a pulse stretching circuit is eliminated.

14 Claims, 4 Drawing Sheets

TIMER CIRCUIT FOR STRETCHING THE DURATION OF AN INPUT PULSE

This is a continuation of application Ser. No. 07/850,912, filed Mar. 13, 1992, now abandoned.

BACKGROUND OF THE INVENTION

1. Field of the Invention

The present invention relates generally to a timer circuit used as an interval timer or the like in an electronic circuit. More particularly, the present invention relates to a timer circuit including circuitry for stretching the duration of an input pulse to a prescribed value.

2. Description of the Prior Art

In an electronic circuit, in order to produce pulses of fixed time duration, usually a one-shot timer (monostable multivibrator) is used. However, a one-shot timer only uses an input pulse as a trigger and therefore cannot be used in applications where it is required to stretch the duration of an input pulse by a prescribed time length.

For such applications, a timer circuit as shown in FIG. 5, for example, has been used heretofore which uses a pulse stretching circuit 11 to stretch the duration of an input pulse by a prescribed time length. The pulse stretching circuit 11 of this timer circuit is constructed in such a way that an input pulse and a pulse produced by delaying the input pulse by a delay time D through a delay circuit 11a are input to an OR circuit 11b. As a result, the OR circuit 11b produces an output pulse with the input pulse duration stretched by the delay time D through the delay circuit 11a, as is shown in FIG. 6.

However, when the input pulse duration is shorter than the delay time D, the output of the OR circuit 11b falls at the falling edge of the input pulse which occurs before the corresponding pulse passed through the delay circuit 11a arrives at the input of the OR circuit 11b. This results in the splitting of the output pulse provided at the output of the OR circuit 11b, as is shown in FIG. 7. Therefore, in applications where there is a possibility that the duration of an input pulse may become short or where it is required to stretch the pulse duration significantly relative to the duration of the input pulse, a timer circuit such as that which is shown in FIG. 8 has been used in the past. The timer circuit of FIG. 8 consists of a plurality of cascaded stages, each constructed with the pulse stretching circuit 11 of FIG. 5 comprising the delay circuit 11a and the OR circuit 11b. The plurality of stages are intended to produce an output pulse with its duration stretched to a desired length even when the input pulse duration is short.

However, even with the plural stage timer circuit shown in FIG. 8, when the input pulse duration is shorter than the delay time provided by the delay circuit 11a in the pulse stretching circuit 11 of each stage, it will be appreciated that the splitting of the output pulse cannot be avoided, as in the case shown in FIG. 7.

Accordingly, the prior art timer circuit has had the problem that it requires a very large number of pulse stretching circuits 11, each providing only a short delay time and increasing the size of the entire circuitry, when the input pulse duration is particularly short and when it is required to stretch the pulse duration significantly.

In view of the above situation, it is an object of the present invention to provide a timer circuit which stretches the duration of an input pulse while avoiding the splitting of the output pulse even when the input pulse duration is particularly short. It is another object of the invention to provide such a timer by including a circuit for securing a minimum value for the input pulse duration.

The present invention overcomes the aforementioned and other shortcomings of the above known and similar timer circuits which use a pulse stretching circuit to stretch the duration of an input pulse by a prescribed time length. The present invention is summarized and is described in detail below.

SUMMARY OF THE INVENTION

A timer circuit is provided wherein, even when the input pulse duration is particularly short, the pulse duration can be stretched at least to a prescribed length; therefore, the input pulse can be prevented from being split when passed through the pulse stretching circuit.

An input pulse is applied to a self-holding circuit in the timer circuit. The output of the self-holding circuit is reset by an active transition of the input pulse (by a rising edge if active high and by a falling edge if active low). A reset delay circuit provided in the self-holding circuit produces an output by delaying the input pulse by a prescribed time (reset delay time d).

When the input pulse duration is longer than the delay time provided by the reset delay circuit, in the self-holding circuit the input pulse goes inactive (falls if active high) after the active transition of the pulse which is fed back through the reset delay circuit. As a result, the previously set output of the self-holding circuit is reset by the inactive transition of the input pulse but independently of the pulse fed back through the reset delay circuit, so that the input pulse appears at the output of the self-holding circuit with its pulse duration unchanged.

Conversely, when the input pulse duration is shorter than the delay time provided by the reset delay circuit, in the self-holding circuit the pulse which is fed back through the reset delay circuit goes active after the inactive transition of the input pulse. As a result, the previously set output of the self-holding circuit is reset by the active transition of the pulse fed back through the reset delay circuit but independently of the inactive transition timing of the input pulse, thus always outputting a pulse having a pulse duration equal to the reset delay time provided by the reset delay circuit.

The input pulse thus passed through the self-holding circuit is then fed to a pulse stretching circuit which produces an output by stretching the duration of the input pulse to a length equal to the delay time. Usually, more than one pulse stretching circuit is coupled together to constitute a succession of stages so that the pulse duration can be stretched up to a length equal to the total sum of the delay times provided by the delay circuits at the plurality of stages.

Even when the input pulse duration is particularly short, the pulse duration can be stretched at least to a length equal to the reset delay time. Therefore, by setting the delay time through each stage of the pulse stretching circuit at a length equal to or shorter than the reset delay time, the input pulse can be surely prevented from being split when passed through the pulse stretching circuit. On the other hand, when the input pulse duration is sufficiently long, the original duration of the input pulse is surely retained and there can be obtained an output pulse stretched by the total delay times through the pulse stretching circuits at the plurality of stages.

According to one aspect of the present invention, a timer circuit is provided which includes a pulse stretching circuit for stretching the duration of an input pulse to a prescribed value, the pulse stretching circuit including delay means for delaying the input pulse by a prescribed time and a self-holding circuit the output of which is set by an active transition of the input pulse and reset by an inactive transition of the input pulse or an active transition of a pulse fed back through the delay means, whichever occurs last, and wherein the output of the self-holding circuit provides the input for the pulse stretching circuit.

According to another aspect of the present invention, the pulse stretching circuit includes a plurality of delay circuits each having essentially the same delay characteristic as that of the delay means. Moreover, according to yet another aspect of the present invention, the sensitivity of the self-holding circuit is set higher than that of the pulse stretching circuit.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
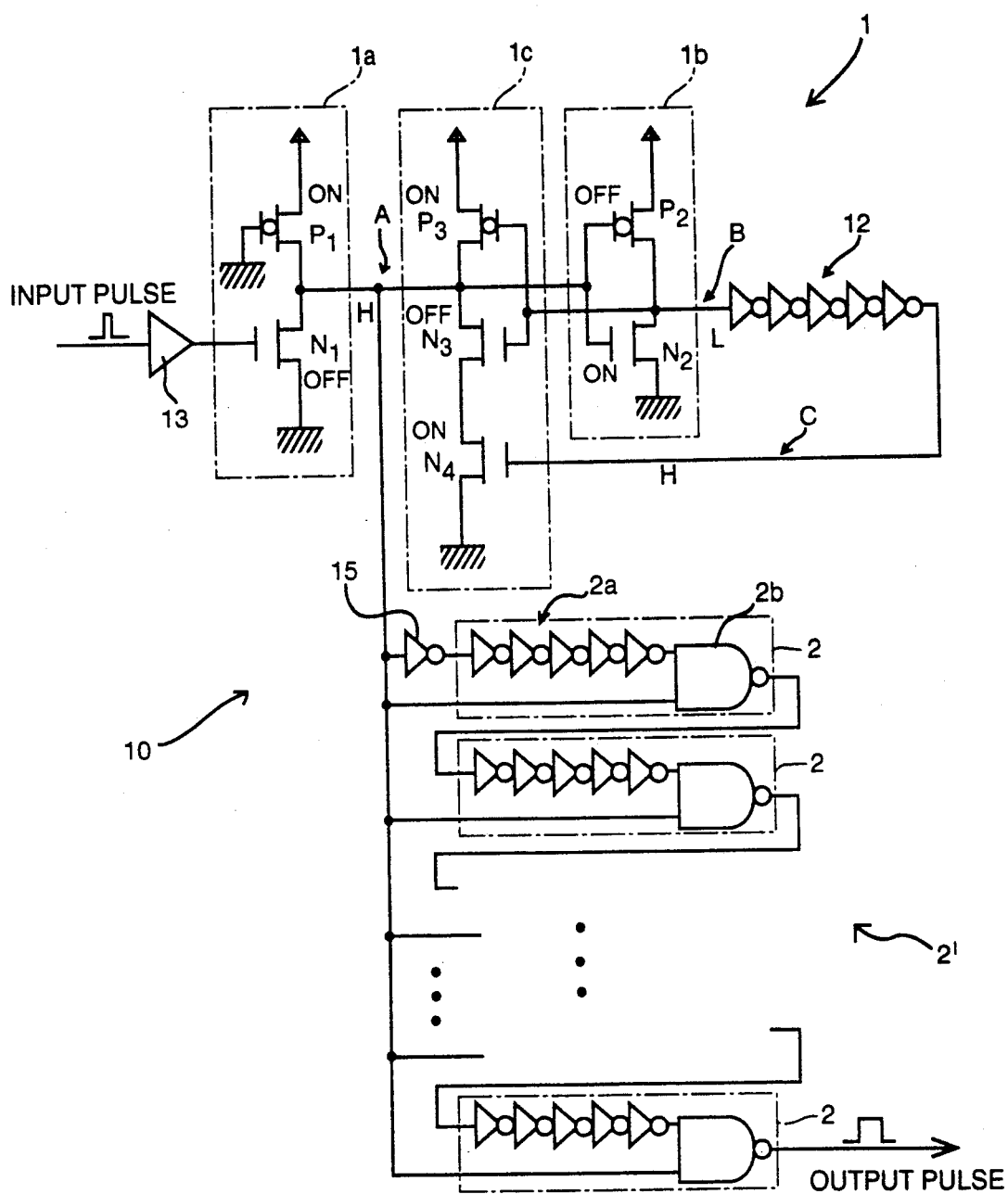
FIG. 1 is a circuit diagram of a timer circuit according to an exemplary embodiment of the present invention.

An embodiment of the present invention will now be described with reference to the accompanying drawings, wherein like reference numerals are used to refer to like elements throughout.

Referring to FIG. 1, a timer circuit 10 according to the present invention is shown. The timer circuit 10 includes a self-holding circuit 1 and a plurality of pulse stretching circuits 2. An input pulse is applied to the self-holding circuit 1 which comprises an input amplifier circuit 1a, CMOS inverter circuits 1b and 1c, and a reset delay circuit 12. The input amplifier circuit 1a comprises a p-channel transistor (hereinafter referred to as a p-transistor) $P_1$ and an n-channel transistor (hereinafter referred to as an n-transistor) $N_1$ coupled in series to each other. This input amplifier circuit 1a provides a higher gain than an ordinary CMOS inverter, such as C-MOS inverter circuits 1b and 1c. The gate of the p-transistor $P_1$ is grounded, and the input pulse is applied to the gate of the n-transistor $N_1$ through an amplifier 13.

The inverter circuit 1b comprises a p-transistor $P_2$ and an n-transistor $N_2$ coupled in series to each other, while the inverter circuit 1c comprises a p-transistor $P_3$ and an n-transistor $N_3$ coupled in series to each other. The node A between the transistors $P_1$ and $N_1$ in the input amplifier circuit 1a is connected to the node between the transistors $P_3$ and $N_3$ in the inverter circuit 1c as well as to the gates of the transistors $P_2$ and $N_2$ in the inverter circuit 1b. The node B between the transistors $P_2$ and $N_2$ is connected to the input of the reset delay circuit 12 and also to the gates of the transistors $P_3$ and $N_3$ in the inverter circuit 1c.

The reset delay circuit 12 in the preferred embodiment comprises five inverter circuits connected in series and delays the input by a reset delay time d to produce an inverted output. The duration of such reset time delay, however, can be varied by changing the number of inverter circuits connected in series as will be appreciated. The output at node C of the reset delay circuit 12 is connected to the gate of an n-transistor $N_4$ inserted between the n-transistor $N_3$ and ground.

In this exemplary embodiment, the output of the self-holding circuit 1 (active low) taken from the node A, is connected to an input of each pulse stretching circuit 2. Each pulse stretching circuit 2 forms a stage in an overall pulse stretching circuit 2'. Each pulse stretching circuit 2 comprises a delay circuit 2a and a NAND gate 2b. In the preferred embodiment, the delay circuit 2a comprises five inverter circuits connected in series, thereby having the same delay characteristic as that of the reset delay circuit 12.

The output (node A) of the self-holding circuit 1 is connected to an input of the NAND circuit 2b in the pulse stretching circuit 2 of each stage. In addition, the output of the self-holding circuit 1 is also connected, via the delay circuit 2a, to the other input of the NAND gate 2b in the pulse stretching circuit 2 of the first stage. An inverter 15 included at the input of the delay circuit 2a provides the appropriate logic inversion to the first stage. For the second and subsequent stages, the output of the NAND gate 2b in the pulse stretching circuit 2 of the preceding stage is connected via the delay circuit 2a to the other input of the NAND gate 2b in the pulse stretching circuit 2 of the following stage. Thus, the output of the NAND gate 2b in the pulse stretching circuit 2 of the final stage is the output of the timer circuit 10 of the present embodiment.

Figure 2:
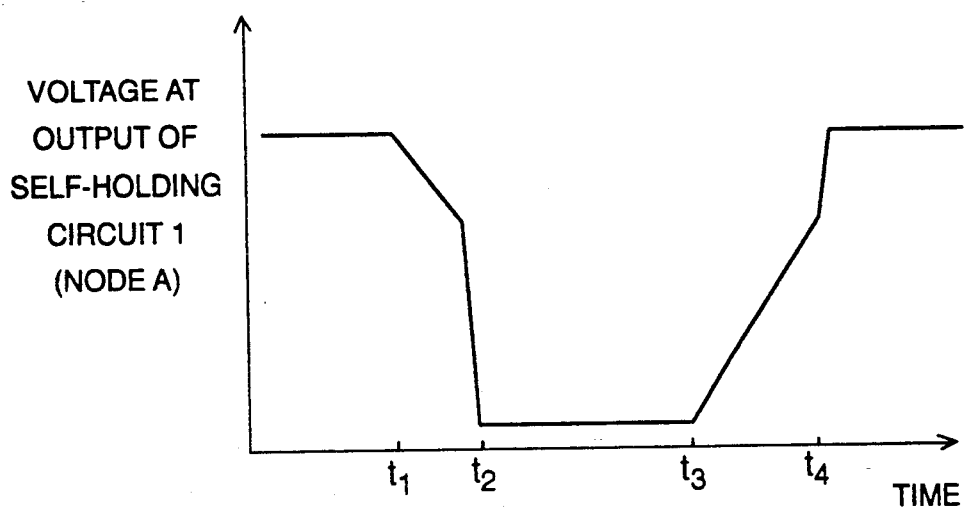
FIG. 2 is a timing chart illustrating the operation of a self-holding circuit included in the timer circuit of FIG. 1 in accordance with the present invention.
Figure 3:
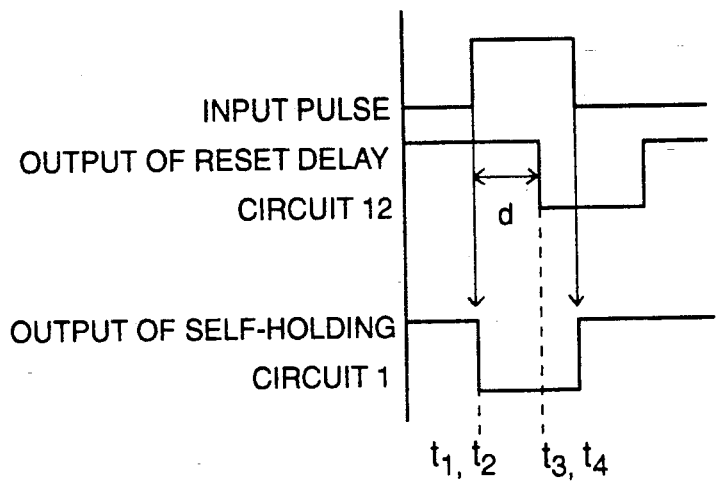
FIG. 3 is a timing chart further illustrating the operation of the self-holding circuit in the timer circuit of FIG. 1 in accordance with the present invention.
Figure 4:
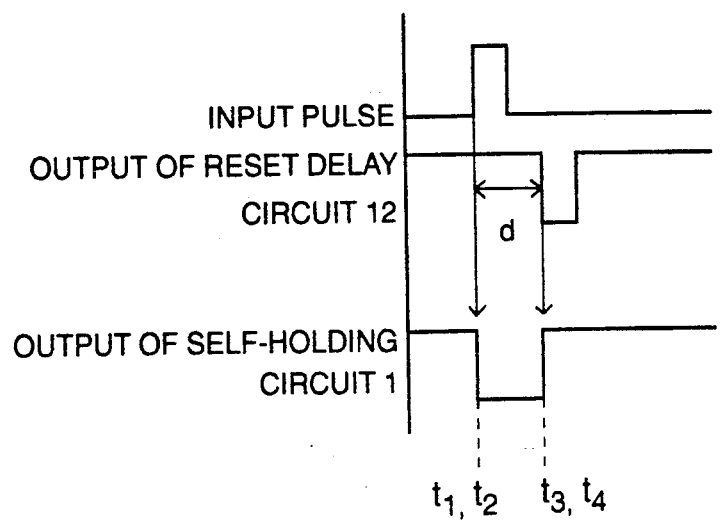
FIG. 4 is a timing chart representing the operation of the self-holding circuit in the timer circuit of FIG. 1 according to the present invention when the input pulse duration is particularly short.
Figure 5:
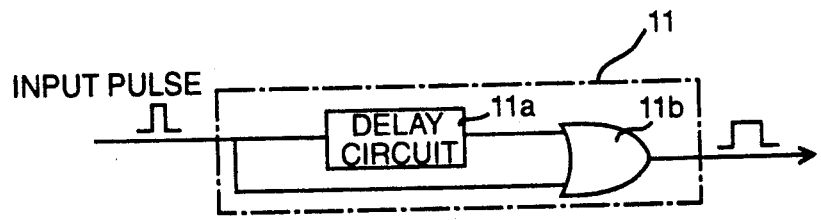
FIG. 5 is a block diagram of a prior art timer circuit.
Figure 6:
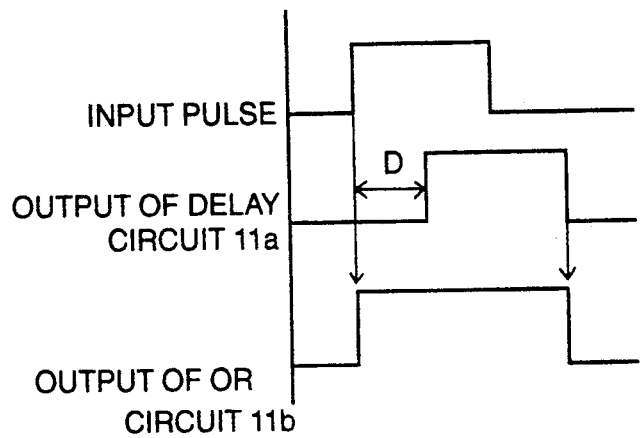
FIG. 6 is a timing chart representing the operation of the prior art timer circuit.
Figure 7:
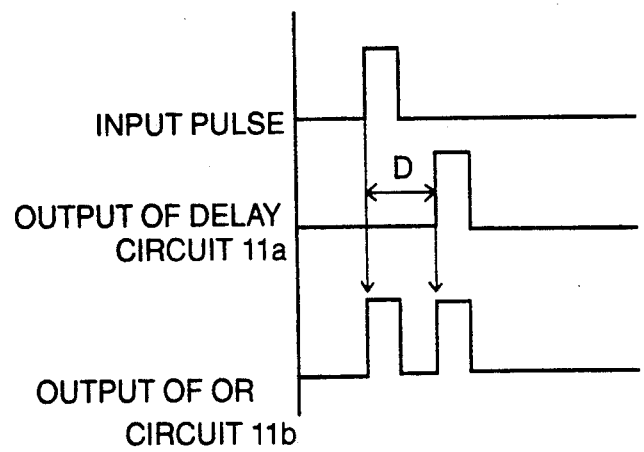
FIG. 7 is a timing chart illustrating the operation of the prior art timer circuit when the input pulse duration is particularly short.
Figure 8:
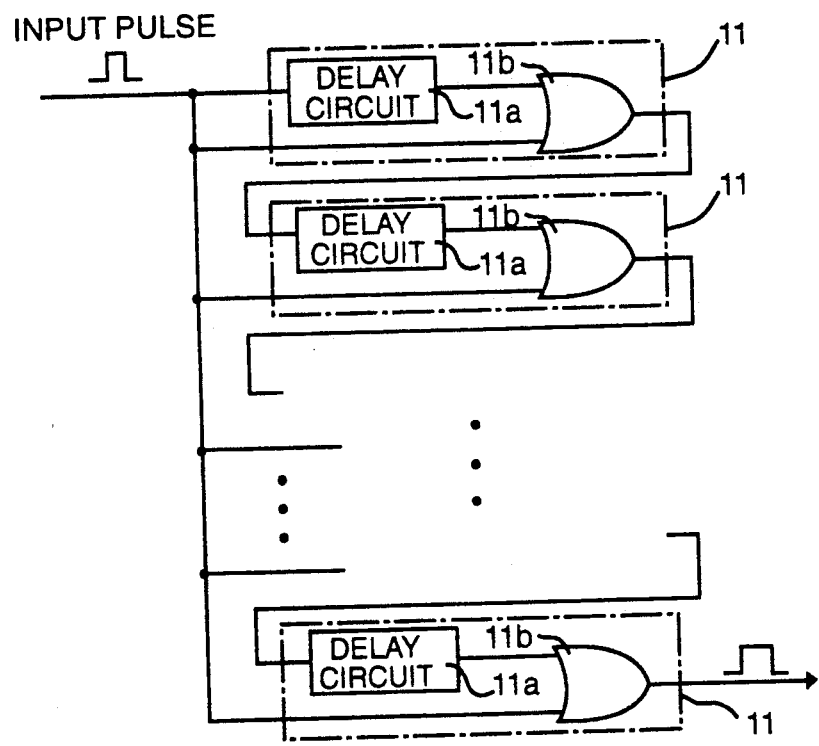
FIG. 8 is a block diagram of a prior art timer circuit consisting of a plurality of stages each constructed with a pulse stretching circuit.

Referring to FIGS. 2 to 4, the operation of the thus configured timer circuit 10 is now explained.

In an initial state prior to time $t_1$ wherein the input signal to the amplifier 13 is at a low level, the n-transistor $N_1$ in the input amplifier circuit 1a is off, as shown in FIG. 1, and the node A is at a high level as shown in FIG. 2. Therefore, the p-transistor $P_2$ and n-transistor $N_2$ in the inverter circuit 1b are off and on, respectively, thus holding the node B at a low level and the node C at a high level as a result of the reset delay circuit 12 having an odd number of inverter circuits connected in series. In the inverter circuit 1c, the p-transistor $P_3$ is on, the n-transistor $N_3$ is off, and the n-transistor $N_4$ is on as indicated in FIG. 1.

In the above initial state, when the input pulse rises at time $t_1$ (FIG. 2), the n-transistor $N_1$ is turned on, causing the node A to go from high to low. More particularly, when the potential at the node A drops below the threshold voltage of the transistors $P_2$ and $N_2$, the p- transistor $P_2$ is turned on and the n-transistor $N_2$ is turned off (represented at time $t_2$). This causes the node B to go from low to high, turning the p-transistor $P_3$ off and the n-transistor $N_3$ on in the inverter circuit $1c$, but since the node C remains high, the n-transistor $N_4$ remains on. The node A is now grounded through the n-transistors $N_3$ and $N_4$, its potential being at a low level and held in this state. In other words, the p-transistors $P_2$ and $P_3$ and the n-transistors $N_2$–$N_4$ constitute a latch circuit. Therefore, even when the input pulse falls to turn off the n-transistor $N_1$ after time $t_2$ but prior to the expiration of the reset time delay d, as represented in FIG. 4, the node A will not return to the initial high level. It should be noted that FIGS. 3 and 4 reflect times $t_1$, $t_2$ and $t_3$, $t_4$ as occurring ideally substantially at the same time and do not reflect the response time of the respective transistors as is shown in FIG. 2.

When the reset time d provided by the reset delay circuit 12 has elapsed from time $t_2$ (i.e. at time $t_3$), the node C goes low and the n-transistor $N_4$ is turned off, releasing the latch that was holding down the potential of the node A. If, at this time, the input pulse has already fallen to an inactive state, as shown in FIG. 4, returning the n-transistors $N_1$ and $N_3$ to the off state, the potential at the node A returns toward the high level. When the potential at the node A exceeds the threshold voltage of the transistors $P_2$ and $N_2$, the p-transistor $P_2$ is turned off and the n-transistor $N_2$ is turned on; thus, all the transistors are set to their original state and the node A quickly returns to its original high level. The node C also returns to its initial state (high level) in due time. Therefore, even when the input pulse duration is particularly short, the pulse output from the self-holding circuit 1 always has a duration equal to the reset delay time d, as shown in FIG. 4.

In reality, the pulse output from the self-holding circuit 1 has a duration slightly longer than the reset delay time d, as can be seen from FIG. 2 and as is referred to above, but usually this can be treated as equivalent to the reset delay time d.

When the input pulse has not yet fallen at time $t_3$, even if the n-transistor $N_4$ returns to the off state, the n-transistor $N_1$ remains on, and therefore, node A is held at the low level. Thereafter, when the input pulse falls returning the n-transistor $N_1$ to the off state, the node A returns to the high level. Therefore, when the input pulse duration is sufficiently long, the self-holding circuit 1 outputs a pulse with the original input pulse duration retained as is represented in FIG. 3.

The pulse output from the self-holding circuit 1 is supplied to the pulse stretching circuit 2 of each stage, as previously described. The pulse is fed from one stage to the next, the pulse duration being stretched through the delay circuit $2a$ in the pulse stretching circuit 2 of each stage; thus, the output pulse of the timer circuit 10 is obtained as the output of the NAND gate $2b$ in the pulse stretching circuit 2 of the final stage. Since the delay circuit $2a$ in the pulse stretching circuit 2 of each stage has the same delay characteristic as that of the reset delay circuit 12, the pulse fed to each pulse stretching circuit 2 always has a pulse duration equal to or longer than the delay time provided by each delay circuit $2a$.

As described above, even when the input pulse duration is particularly short, the self-holding circuit 1 stretches the pulse duration at least to a length equal to the reset delay time d, which serves to prevent the input pulse from being split when passed through each pulse stretching circuit 2. On the other hand, when the input pulse duration is sufficiently long, the original duration of the input pulse is retained and an output pulse stretched by the total delay times through the pulse stretching circuits 2 at the plurality of stages can be obtained.

Furthermore, when the sensitivity of the self-holding circuit 1 is set higher than that of each pulse stretching circuit 2, the timer circuit 10 of the present invention can be operated reliably even when the input pulse is unstable.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A timer apparatus comprising:
   a self-holding means for receiving an input pulse and for outputting a first signal having a prescribed pulse duration to a first node; and
   a pulse stretching means for receiving said first signal and for stretching a pulse duration of said first signal by a prescribed time,
   said self-holding means comprising:
      a first inverting means coupled to said first node;
      an input amplifying means for receiving said input pulse and for generating a second signal in response to said input pulse, a level of said second signal representing an inverted level of said input pulse, and an output of said input amplifying means being connected to said first node;
      a second inverting means for receiving said first signal via said first node and for generating a third signal; and
      a reset delay means for receiving said third signal via a second node and for generating a reset signal delayed by a prescribed delay time, said reset signal resetting said self-holding means;
      wherein said first inverting means receives said third signal via said second node and said reset signal and generates a fourth signal, which is an output of the first inverting means, and
      wherein said second signal and said fourth signal are supplied to the first node to provide said first signal to said pulse stretching means.

2. A timer apparatus according to claim 1, wherein said input amplifying means includes a p-channel transistor and an n-channel transistor coupled in series, and wherein said first node is located between said p-channel and n-channel transistors of said input amplifying means.

3. A timer apparatus according to claim 1, wherein a gate of said p-channel transistor is grounded and said input pulse is applied to a gate of said n-channel transistor.

4. A timer apparatus according to claim 1, wherein said second inverting means includes a p-channel transistor and an n-channel transistor coupled in series, and wherein said second node is located between said p-channel and n-channel transistors of said second inverting means.

5. A timer apparatus according to claim 4, wherein a gate of said p-channel transistor and a gate of said n-channel transistor are connected to said first node.

6. A timer apparatus according to claim 1, wherein said reset delay means includes an odd number of inverter circuits coupled in cascade connection.

7. A timer apparatus according to claim 1, wherein said first inverting means includes a p-channel transistor and an n-channel transistor coupled in series with said first node located between said p-channel and n-channel transistors of said first inverting means, and further including a transistor positioned between the ground and the series circuit of said p-channel transistor and said n-channel transistor.

8. A timer apparatus according to claim 7, wherein a gate of said p-channel transistor and a gate of said n-channel transistor are connected and said second node is located along such connection, and wherein a gate of said transistor is connected to an output of said reset delay means.

9. A timer apparatus according to claim 1, wherein said pulse stretching means includes a plurality of pulse stretching circuits.

10. A timer apparatus according to claim 9, wherein said pulse stretching means includes at least one inverter inserted between said first node and at least one of said plurality of pulse stretching circuits.

11. A timer apparatus according to claim 9, wherein said plurality of pulse stretching circuits respectively includes a logic circuit.

12. A timer apparatus according to claim 9, wherein said plurality of pulse stretching circuits respectively includes delay circuits each having the same prescribed delay time as that of said reset delay means.

13. A timer apparatus according to claim 12, wherein each of said delay circuits includes a plurality of inverter circuits coupled in cascade connection.

14. A timer apparatus comprising:
a self-holding means for providing an output pulse in response to an active transistion of an input pulse, said self-holding means including latching means for providing said output pulse with a predetermined fixed duration in the event said input pulse has a duration which does not exceed a predetermined minimum duration, and for providing said output pulse with a duration substantially equal to said input pulse duration in the event said input pulse duration exceeds said predetermined minimum duration; and
pulse stretching means for stretching the duration of said output pulse provided by said self-holding means to a prescribed value, wherein an output state of self-holding means is inverted before an output state of said pulse stretching means.

* * * * *